(12) United States Patent
Lin et al.

(10) Patent No.: US 6,707,748 B2
(45) Date of Patent: Mar. 16, 2004

(54) BACK UP POWER EMBODIED NON-VOLATILE MEMORY DEVICE

(75) Inventors: Yu-Chuan Lin, Hsinchu (TW);
Chun-Chieh Chen, Tai-Nan (TW);
Hung-Ju Shen, Taipei (TW);
Chien-Hua Wu, Miao-Li (TW);
Sheng-Lin Chiu, Nan-Tou (TW);
Huan-Tung Wang, Hsinchu (TW);
Hsin-Chih Hung, Yun-Lin (TW)

(73) Assignee: Ritek Corporation, Hsinchu (TW)

( * ) Notice: Subject to any disclaimer, the term of this patent is extended or adjusted under 35 U.S.C. 154(b) by 0 days.

(21) Appl. No.: 10/248,251

(22) Filed: Dec. 31, 2002

(65) Prior Publication Data

US 2003/0210601 A1 Nov. 13, 2003

(30) Foreign Application Priority Data

May 7, 2002 (TW) ...................................... 91206362 U

(51) Int. Cl.[7] ................................................. G11C 7/00
(52) U.S. Cl. ........................ 365/228; 365/226; 365/229
(58) Field of Search ................................ 365/228, 229, 365/222, 185.05, 226, 189.08

(56) References Cited

U.S. PATENT DOCUMENTS

| | | | | |
|---|---|---|---|---|
| 5,630,093 A | * | 5/1997 | Holzhammer et al. | ...... 711/115 |
| 6,181,630 B1 | * | 1/2001 | Caulkins | ...................... 365/228 |
| 6,336,174 B1 | * | 1/2002 | Li et al. | ....................... 711/162 |
| 6,614,708 B1 | * | 9/2003 | Lin et al. | ...................... 365/228 |

\* cited by examiner

*Primary Examiner*—Richard Elms
*Assistant Examiner*—Hien Nguyen
(74) *Attorney, Agent, or Firm*—Jiang Chyun IP Office

(57) ABSTRACT

A back up power embodied non-volatile memory device including a connection port, a power supply unit and a memory system. A host machine provides data and power to the connection port through an external bus. The memory system holds the data received from the connection port temporarily and transfers the data to a non-volatile memory unit inside the memory system. The power supply unit provides necessary power to complete the transfer of temporarily stored data inside the memory system to the non-volatile memory unit to become readable data when host power suddenly fails.

30 Claims, 6 Drawing Sheets

BACK UP POWER EMBODIED NON-VOLATILE MEMORY DEVICE

CROSS REFERENCE TO RELATED APPLICATIONS

This application claims the priority benefit of Taiwan application serial no.91206362, filed on May 7, 2002.

BACKGROUND OF INVENTION

1. Field of Invention

The present invention relates to a non-volatile memory device. More particularly, the present invention relates to a back up power embodied non-volatile memory device.

2. Description of Related Art

Due to the popularization of electronic products, digital data is now routinely stored in memory devices for subsequent recall. To increase portability and facilitate easy access to stored digital data, detachable hard disks or optical disks have been used in the past. However, these conventional devices have several drawbacks. For example, a hard drive or an optical disk may store a large volume of data, however the intricate internal structure inside the hard drive is vulnerable to shock and impact. Although an optical disk is less vulnerable to impact, each optical disk has a fixed memory capacity and requires special read-out equipment such as a re-writable optical device to access and re-write data. In other words, both detachable hard drives and optical disks are easy to use but inconvenient to carry.

To increase portability of storage devices and limit the need for special devices, manufacturers have developed non-volatile memory devices such as flash memory. These non-volatile memory devices may connect with a host system through various types of external bus interfaces including, for example, the universal serial bus (USB) interface, RS232 interface and the 1394 interface. The non-volatile memory device not only carries out data transfer with the host system via the external bus, but also obtains power from the host system via the external bus as well. Portability and ease of connection with various host systems are the major reasons for the popularity of non-volatile memory devices. However, the non-volatile memory device must engage with the external bus of a host system to access and transfer data. Hence, any untimely unplugging of the device from the external bus may corrupt the data inside a file. If the memory device is unplugged during a file allocation table (FAT) refreshing operation, an incomplete FAT file is created due to the sudden power outage.

In brief, untimely unplugging of externally connected non-volatile memory devices may lead to possible deletion of transfer data or so damage the links in a FAT file that important data is forever lost.

SUMMARY OF INVENTION

Accordingly, one object of the present invention is to provide a back up power embodied non-volatile memory device. The device contains a back up internal power source that automatically cuts in when external power to the device suddenly terminates. The back up internal power source provides necessary power to download data already transferred to the memory into appropriate files and execute other necessary programs to render the file readable. In addition, if power to the non-volatile memory device is accidentally cut when a file allocation table (FAT) is being refreshed, the back up power also provides the necessary power for completing the refresh operation.

To achieve these and other advantages and in accordance with the purpose of the invention, as embodied and broadly described herein, the invention provides a back up power embodied non-volatile memory device. The memory device includes a connection port, a power supply unit and a memory system. Host data and host power are provided to the non-volatile memory device through an external bus of the connection port. The memory system temporarily holds the data picked up by the connection port and subsequently transfers the data to the non-volatile memory. The power supply unit provides back up power to the memory system when power from the host system is cut. Hence, the temporarily stored data inside the memory system is ultimately transferred to the non-volatile memory to become readable data.

This invention also provides an alternative back up power embodied non-volatile memory device. The memory device includes a connection port, a buffer unit, a non-volatile memory, a battery and a memory controller. The connection port is connected to a host system. The host system provides host data and host power to the back up power embodied non-volatile memory device through the external bus on the connection port. The buffer unit temporarily holds data received by the connection port. The memory controller controls the writing of data from the buffer unit into the non-volatile memory and monitors the presence of host power. When host power is cut out in the middle of a data transfer operation, the battery provides back up power to complete the write, operation.

The connection port is an interface connection device suitable for interfacing with any one of the following interfaces, including the universal serial bus (USB) interface, the 1394 interface, the RS232 interface, the parallel transmission interface, the PCMCIA interface, the CF interface, the SD interface, the MMC interface and the memory stick interface.

The back up power embodied non-volatile memory device according to this invention is capable of detecting any change in the power provided by the host system. If host system power suddenly fails before the completion of a data transfer operation, internal back up power immediately cuts in to complete the writing of transmitted data into the non-volatile memory. Hence, the invention guarantees the writing of all received data into the non-volatile memory so that none of the data transmitted to the non-volatile memory device is lost.

In addition, the back up power within the non-volatile memory device also provides necessary power to complete any FAT refreshing operation if host power is cut prematurely. Hence, integrity of the stored data can be maintained.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
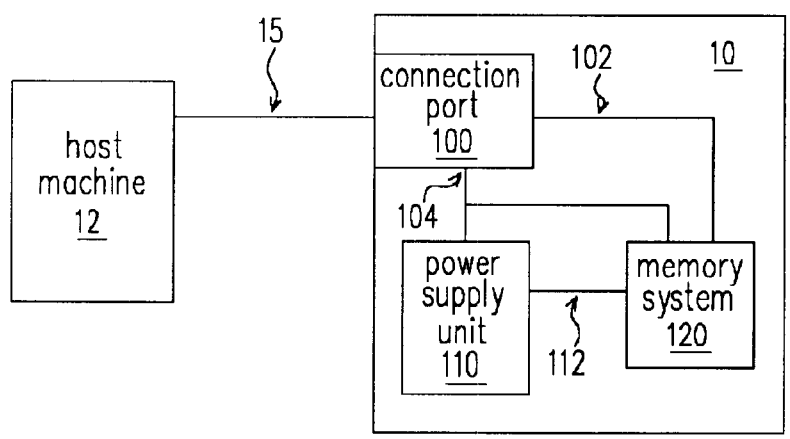
FIG. 1 is a block diagram of a host/memory system according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram of a host/memory system according to one preferred embodiment of this invention. As shown in FIG. 1, the back up power embodied non-volatile memory device 10 includes a connection port 100, a power supply unit 110 and a memory system 120 (drawn not to scale). A host system 12 communicates with the connection port 100 through an external bus 115. Aside from providing data to the non-volatile memory device 10 via the external bus 15, the host system 12 also provides power to activate the non-volatile memory device 10. Here, the external bus includes any one of the following interfaces: the universal serial bus (USB) interface, the 1394 interface, the RS232 interface, the parallel transmission interface, the personal computer memory card (PCMCIA) interface, the flash card (CF) interface, the safety digital (SD) memory card interface, the multimedia memory card (MMC) interface and the memory stick interface. Correspondingly, the connection port 100 is an interface connection device capable of connecting with any one of the aforementioned interfaces.

Data picked up by the connection port 100 from the host system 12 is transferred to the memory system 120 via a data signaling line 102. Conversely, data read from the memory system 120 is transferred to the connection port 100 via the data signaling line 102. Thereafter, the data is transferred from the connection port 100 to the host system 12 via the external bus 115. Since reading data from the memory 120 will not cause any disruption of stored data, the subsequent discussion centers around writing data into the memory system 120.

In general, the process of writing data into the memory system 120 involves three stages. In the first stage, data is written into the memory in batches. After all the data is written into a particular file, information regarding the file is written to a file description block. Finally, the file allocation table is refreshed so that a user may access this particular file. Because a file register must retain information such as primary/secondary file name, attributes, reserve, time, date, indicator, size and other related data, losing any one of these items may lead to incomplete storage of the file. Moreover, file information is only registered after all relevant file data has been written into the memory system 120. Hence, if power to the non-volatile memory device 10 is cut before all file data is written in, the user has no way of accessing the previously written data within the file.

To resolve this problem, this invention introduces a power supply unit 110 inside the non-volatile memory device to serve as a back up in case of a power interruption. Using the power provided by the back up unit 110, the data already transferred into the memory system 120 is written into a file followed by modifying the content within the file register. In this way, even if power is cut half way through the transmission of a file, the non-volatile memory device 10 still can retain the already transferred portion of data.

If the power outage occurs while refreshing the file allocation table, content within the file allocation table may be corrupted and prevent the access of previously stored files. This problem is also resolved by introducing the power supply unit 110. The power supply unit 110 provides all the necessary power to finish the refreshing operation should a sudden power failure occur.

The memory system 120 may use a control signal line 112 to control the power supply unit 110. In general, the back up power unit 110 remains in a standby mode if the host system 12 is operating normally. However, the power provided by the host system may suddenly fail before the transfer of data into the memory system 120 or the update of the file allocation table is complete. In this case, the power supply unit 110 will step in and provide necessary power to complete all operations.

Figure 2:
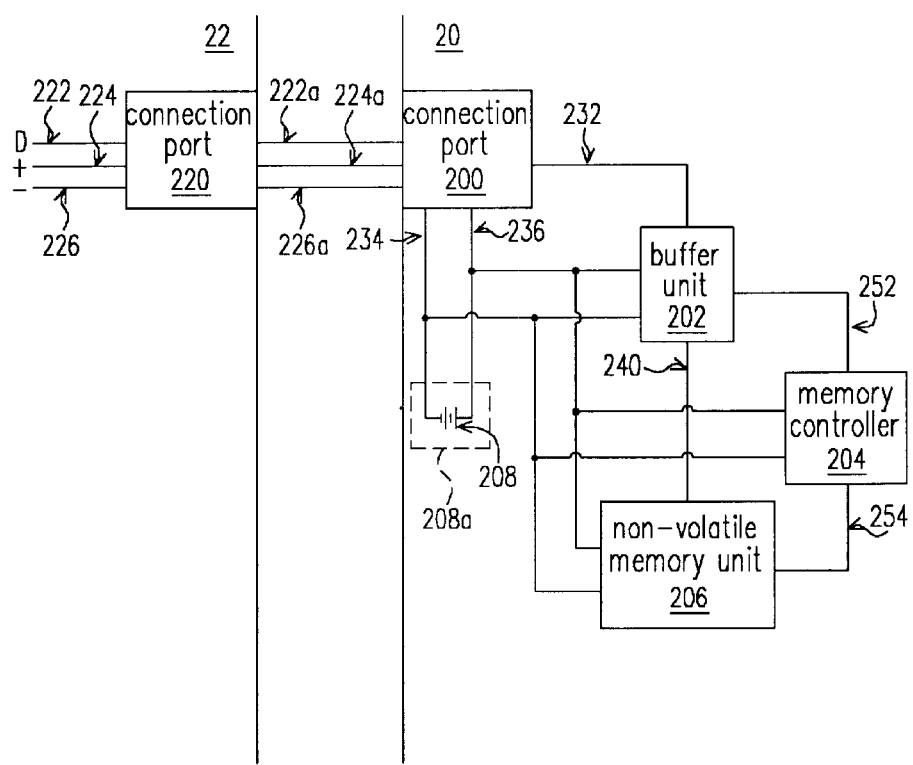
FIG. 2 is a block diagram showing a circuit layout of a host/memory system according to another preferred embodiment of this invention.

FIG. 2 is a block diagram showing a circuit layout of a host/memory system according to another preferred embodiment of this invention. As shown in FIG. 2, data (D) is transmitted to a connection port 220 inside a host system 22 through a data signal line 222 (an internal bus). The connection port 220 also picks up a host voltage through a pair of power lines 224 (+) and 226 (−). A connection port 200 inside a non-volatile memory device 20 picks up the host data and the host voltage through an external bus (including a data signal line 222a and a pair of power lines 224a and 226a). The host voltage is re-directed from the connection port 200 to a buffer unit 202, a memory controller 204 and a non-volatile memory unit 206 through a pair of power lines 234 and 236. The host voltage provides all the power for driving the buffer unit 202, the memory controller 204 and the non-volatile memory unit 206. Host data is transferred from the connection port 200 to the buffer unit 202 through a data signal line 232 for temporary storage. Thereafter, the memory controller 204 schedules the transfer of data from the buffer unit 202 to the non-volatile memory unit 206.

In this invention, the presence or absence of host power is monitored by a built-in firmware inside the memory controller 204 or a voltage feedback module 310 as shown in FIG. 3. The host power may even be monitored through the response of a battery 208. In the following, an operation mode that utilizes the response of a battery 208 is described with reference to FIG. 2.

As host power suddenly fails or the external bus is accidentally unplugged leading to a failure to supply necessary power for driving the non-volatile memory device 20, voltage on the pair of power lines 234 and 236 will gradually drop. When the voltage drops to a level below the voltage provided by the back up battery 208, the battery 208 cuts in as a power source substitute. The memory controller 204 utilizes the back up power to transfer the temporarily registered data inside the buffer unit 202 to the non-volatile memory unit 206. On completion of data transfer, file registers are updated and the file allocation table is refreshed.

Aside from directly responding to the battery 208, the battery 208 and the built-in firmware inside the memory controller 204 may also be used together for detecting any voltage variation. After directing the transfer of all data from the buffer unit 202 to the non-volatile memory unit 206 and the updating of file registers and file allocation table, the memory controller 204 sends signals via control signal lines 252 and 254 to stop the buffer unit 202, the memory controller 204 and the non-volatile memory unit 206 from receiving any power through the power lines 234 and 236 so that some back up power is saved. Note that more energy is saved if the power supply line from the battery 208 is directly cut as shown in FIG. 3B. Only an additional switch 320 controlled by the memory controller 204 at the output circuit of the battery 208 is required.

Figure 3A:
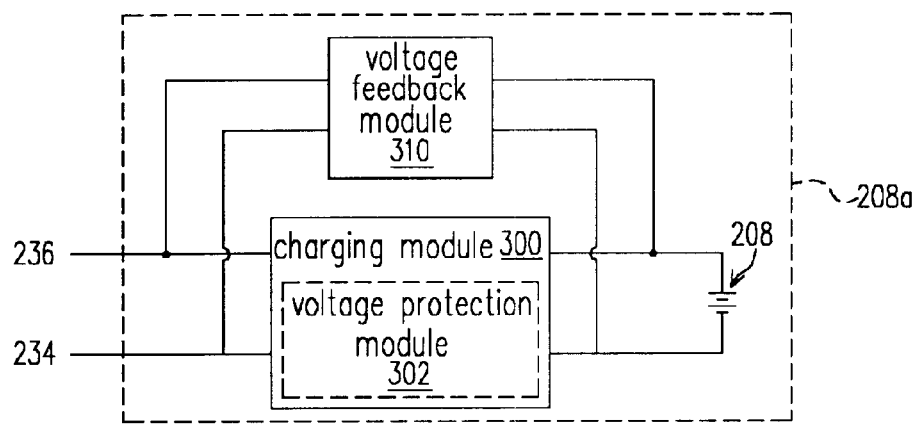
FIG. 3A is a block diagram showing a circuit layout of the power supply unit 208a in FIG. 2.
Figure 3B:
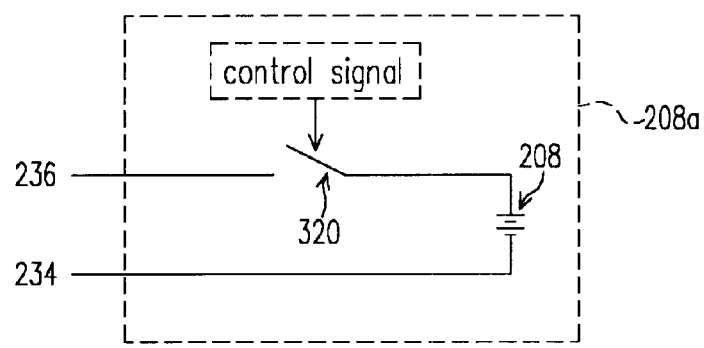
FIG. 3B is a block diagram showing an alternative circuit layout of the power supply unit 208a in FIG. 2.

FIG. 3A is a block diagram showing a circuit layout of the power supply unit 208a in FIG. 2. As shown in FIG. 3A, the power supply unit 208a includes a voltage feedback module 310 for detecting the presence of host power. Note that the battery 208 is charged via a charging module 300 that consumes host power. However, the charging module 300 is not an essential component in this invention as indicated in FIG. 2.

The charging module in FIG. 3A further includes a voltage protection module 302 that protects the charging module against a sudden power surge or a heightened voltage. During normal operation, the host power will charge up the battery 208 through the charging module 300. The voltage feedback circuit 310 is able to detect any drop in voltage provided by the host power through the change in potential across the power lines 234 and 236. The battery 208 immediately kicks in and provides back up power to the power lines 234 and 236. Since subsequent operations are identical to the ones in FIGS. 2 and 3B, detailed description is omitted.

In general, external buses transmit a voltage in the 5V range. The components inside the non-volatile memory device 20 such as the memory system 120, the buffer unit 202, the memory controller 204 and the non-volatile memory unit 206 may operate without any voltage regulator since they operate at 5V. However, anyone familiar with the technology may add a voltage regulator so that memory devices operating at other voltage ranges may also be used.

Figure 4A:
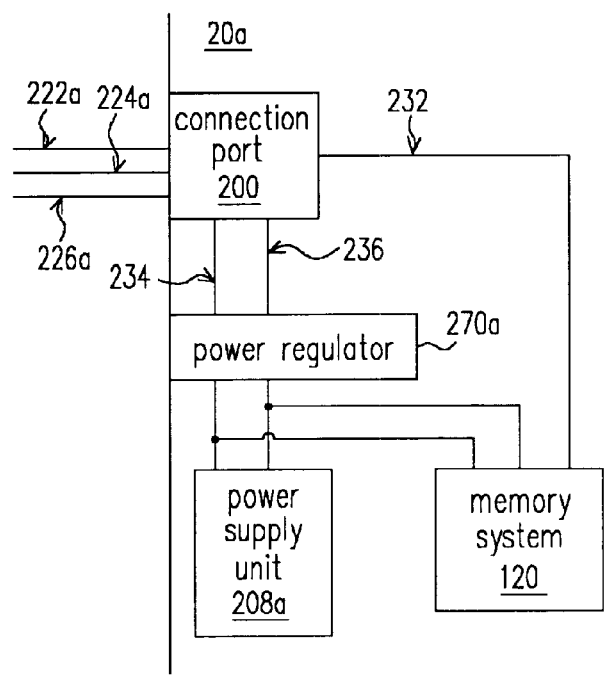
FIG. 4A is a block diagram showing a circuit layout of a host/memory system having a power regulator therein according to another preferred embodiment of this invention.
Figure 4B:
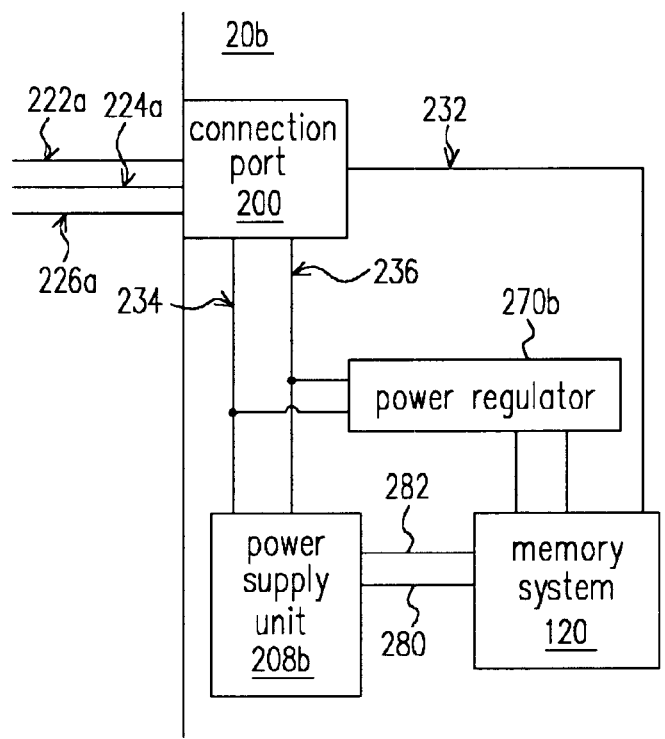
FIG. 4B is a block diagram showing a circuit layout of a host/memory system having a power regulator therein according to yet another preferred embodiment of this invention.

FIGS. 4A and 4B are block diagrams showing two circuit layouts of a host/memory system that incorporates a power regulator. In FIGS. 4A and 4B, components similar to the ones in FIG. 2 are labeled identically. To simplify explanation, the buffer unit 202, the memory controller 204 and the non-volatile memory unit 206 in FIG. 2 are combined together to form a memory system just like the memory system 120 in FIG. 1. In FIG. 4A, host power received by the connection port 200 is transmitted to a power regulator 270a. The power regulator 270a converts the host power into a voltage suitable for operating internal devices such as the memory system 120 or the power supply unit 208a and then transmits the voltage to these devices. In FIG. 4B, host power received by the connection port 200 is transmitted to a power regulator 270b and a power supply unit 208b. The power regulator 270b converts the host power into a voltage suitable for operation of the memory system 120. The power supply device 208b remains in a standby mode and provides back up power to the memory system through a pair of power lines 280 and 282 when necessary.

Furthermore, anyone familiar with the aforementioned design concept may tailor the circuit design to suit a particular need. For example, the power provided by the supply unit 208b in FIG. 4B may pass through the power regulator 270b for conversion into a suitable voltage before providing necessary power to the memory system 120. Therefore, the aforementioned embodiment should be regarded as an example rather than a limitation of the range of application in this invention. Moreover, in the embodiment having a power regulator, the memory system and the power supply unit may work at a voltage different from the host power voltage transmitted through the external bus. The design may change according to cost and other circuit considerations.

In this invention, the back up power is preferably provided by a re-chargeable battery. Yet, a non-chargeable battery such as a button battery may similarly be applied to this invention. In addition, a circuit that can temporarily store energy and release energy in a voltage drop may be employed also. Circuits belonging to such a category, including the capacitor circuit, the capacitor/inductor circuit and the capacitor/inductor/resistor circuit, may serve as a principle component inside the power supply unit.

Table 1 lists major advantages of a non-volatile memory device fabricated according to this invention and compared with the device fabricated according to the conventional techniques.

TABLE 1

| State Occurrence | Conventional Technique | According to this Invention |
| --- | --- | --- |
| Sudden termination of power while writing a file, data not yet written into the non-volatile memory, but 5 batches of communication records already stored inside the buffer unit. | File completely absent | The 5 batches of communication records inside the buffer unit are written to the non-volatile memory and the file registers and file allocation tables are updated, user may read out a file having 5 batches of communication records. |
| Sudden termination of power while writing a file, 20 batches of communication records already written into the non-volatile memory, additional 10 batches temporarily stored inside the registers | 1. File absent. 2. File present but file registers in error and hence the file cannot be read. 3. Error in the file allocation table leading to inaccessibility of file data. | The 10 batches of communication records inside the buffer unit are written to the non-volatile memory and the file registers and file allocation tables are updated, user may read out a file having 30 |

TABLE 1-continued

| State Occurrence | Conventional Technique | According to this Invention |
| --- | --- | --- |
| and 70 batches waiting for transmission. | | batches of communication records. |
| Sudden termination of power while writing a file, 90 batches of communication records already written into the non-volatile memory, additional 10 batches temporarily stored inside the registers and the host has no residual data. | 1. File absent. 2. File present but file registers in error and hence the file cannot be read. 3. Error in the file allocation table leading to inaccessibility of file data. | The 10 batches of communication records inside the buffer unit are written to the non-volatile memory and the file registers and file allocation tables are updated, user may read out a file containing all the communication records. |

Figure 5:
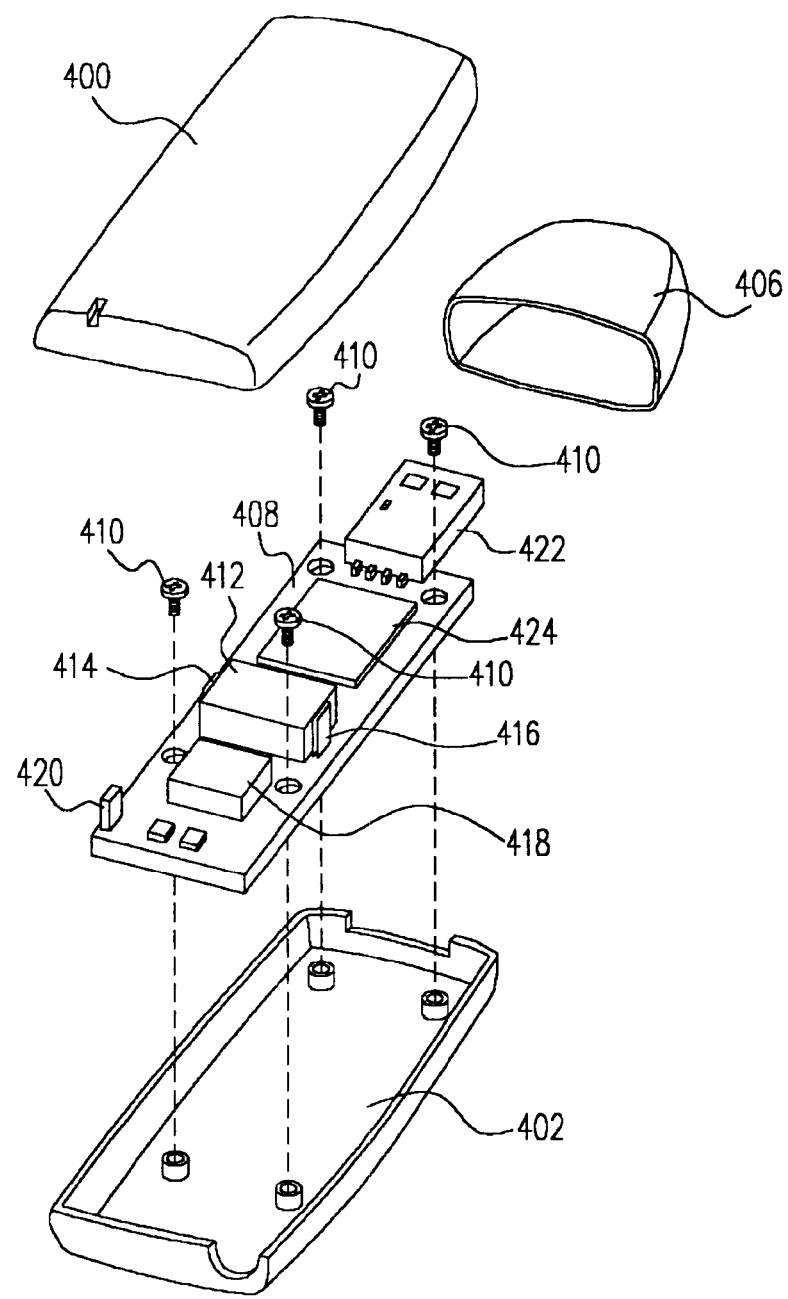
FIG. 5 is an explosion view of the components constituting a complete non-volatile memory package manufactured according to one preferred embodiment of this invention.

FIG. 5 is an explosion view of the components constituting a complete non-volatile memory package manufactured according to one preferred embodiment of this invention. Through the component diagram, the non-volatile memory device is easily manufactured.

In summary, one major aspect of this invention is the provision of a back up power supply inside the non-volatile memory device so that data already transmitted to the device may be transferred to the non-volatile memory unit. Hence, this invention guarantees the transfer of already transmitted data into the non-volatile memory unit so that none of the transmitted data is lost by sudden power failure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A back up power embodied non-volatile memory device, comprising:
    a connection port connected electrically to a host machine, wherein the host machine provides host data and power to the connection port through an external bus;
    a battery for providing back up power;
    a buffer unit for holding data from the connection port temporarily;
    a non-volatile memory unit; and
    a memory controller for scheduling the writing of data from the buffer unit to the non-volatile memory unit, monitoring the presence or absence of host power and supplying back up power to write the remaining data into the non-volatile memory unit if the host power disappears before data is completely written.

2. The non-volatile memory device of claim 1, wherein the connection port may link up with an interface connection device selected from a group consisting of the universal serial bus interface, the 1394 interface, the serial transmission interface, the parallel transmission interface, the personal computer memory card interface, the flash card memory interface, the safety digital memory card interface, the multimedia memory card interface and the memory stick interface.

3. The non-volatile memory device of claim 1, wherein the device further includes a voltage feedback module for detecting the absence of host power and provides back up power when the host power fails.

4. The non-volatile memory device of claim 1, wherein the device further includes a charging module for receiving host power and using the host power to charge up the battery.

5. The non-volatile memory device of claim 4, wherein the charging module further includes a battery protection module that protects the battery against a heightened voltage.

6. The non-volatile memory device of claim 1, wherein the memory controller also provides back up power to complete a file allocation table refresh operation if the host power disappears in the middle of the file allocation table refresh operation.

7. The non-volatile memory device of claim 1, wherein the device further includes a power regulator for adjusting host power to a suitable voltage before driving the buffer unit, the non-volatile memory unit and the memory controller.

8. The non-volatile memory device of claims 1, wherein the battery includes a non-rechargeable battery.

9. The non-volatile memory device of claims 1, wherein the battery includes a chargeable battery.

10. A back up power embodied non-volatile memory device, comprising:
    a connection port connected electrically to a host machine, wherein the host machine provides host data and power to the connection port through an external bus;
    a memory system for holding data from the connection port temporarily and writing the data into a non-volatile memory unit; and
    a power supply unit for providing back up power to the memory system so that the temporarily stored data is written into the non-volatile memory unit to become readable data if host power suddenly fails.

11. The non-volatile memory device of claim 10, wherein the connection port may link up with an interface connection device selected from a group consisting of the universal serial bus interface, the 1394 interface, the serial transmission interface, the parallel transmission interface, the personal computer memory card interface, the flash card memory interface, the safety digital memory card interface, the multimedia memory card interface and the memory stick interface.

12. The non-volatile memory device of claim 10, wherein back up power to the memory system is cut after all temporarily stored data is written into the non-volatile memory unit to become readable data.

13. The non-volatile memory device of claim 10, wherein the power supply unit further includes a charging module for receiving host power and using the host power to charge up the back up power.

14. The non-volatile memory device of claim 10, wherein the memory system also utilizes the back up power to complete a file allocation table refresh operation if the host power disappears in the middle of the file allocation table refresh operation.

15. The non-volatile memory device of claim 10, wherein the device further includes a power regulator for adjusting host power to a suitable voltage level before being sent to the memory system.

16. The non-volatile memory device of claims 10, wherein the power supply unit includes a non-rechargeable battery.

17. The non-volatile memory device of claims 10, wherein the power supply unit includes a chargeable battery.

18. The non-volatile memory device of claims 10, wherein power supply unit includes a circuit selected from a group consisting of a capacitor circuit, a capacitor/inductor circuit and a capacitor/inductor/resistor circuit.

19. A back up power embodied non-volatile memory device, comprising:
- a connection port connected electrically to a host machine, wherein the host machine provides host data and power to the connection port through an external bus;
- a battery for providing back up power;
- a buffer unit for holding data from the connection port temporarily;
- a non-volatile memory unit; and
- a memory controller for scheduling the writing of data from the buffer unit to the non-volatile memory unit.

20. The non-volatile memory device of claim 19, wherein the connection port may link up with an interface connection device selected from a group consisting of the universal serial bus interface, the 1394 interface, the serial transmission interface, the parallel transmission interface, the personal computer memory card interface, the flash card memory interface, the safety digital memory card interface, the multimedia memory card interface and the memory stick interface.

21. The non-volatile memory device of claim 19, wherein the device further includes a power regulator for adjusting host power to a suitable voltage level before driving the buffer unit, the non-volatile memory unit and the memory controller.

22. The non-volatile memory device of claims 19, wherein the battery includes a non-rechargeable battery.

23. The non-volatile memory device of claims 19, wherein the battery includes a chargeable battery.

24. A back up power embodied non-volatile memory device, comprising:
- a connection port connected electrically to a host machine, wherein the host machine provides host data and power to the connection port through an external bus;
- a memory system for holding data from the connection port temporarily and writing the data into a non-volatile memory unit; and
- a power supply unit for providing back up power to the memory system if host power suddenly fails.

25. The non-volatile memory device of claim 24, wherein the connection port may link up with an interface connection device selected from a group consisting of the universal serial bus interface, the 1394 interface, the serial transmission interface, the parallel transmission interface, the personal computer memory card interface, the flash card memory interface, the safety digital memory card interface, the multimedia memory card interface and the memory stick interface.

26. The non-volatile memory device of claim 24, wherein the power supply unit further includes a charging module for receiving host power and using the host power to charge up the back up power.

27. The non-volatile memory device of claim 24, wherein the device further includes a power regulator for adjusting host power to a suitable voltage level before being sent to the memory system.

28. The non-volatile memory device of claims 24, wherein the power supply unit includes a non-rechargeable battery.

29. The non-volatile memory device of claims 24, wherein the power supply unit includes a chargeable battery.

30. The non-volatile memory device of claims 24, wherein the power supply unit includes a circuit selected from a group consisting of a capacitor circuit, a capacitor/inductor circuit and a capacitor/inductor/resistor circuit.

* * * * *